(12) United States Patent
Danilatos

(10) Patent No.: US 6,396,064 B1
(45) Date of Patent: May 28, 2002

(54) DIFFERENTIAL PUMPING VIA CORE OF ANNULAR SUPERSONIC JET

(76) Inventor: Gerasimos Daniel Danilatos, 98 Brighton Boulevard, North Bondi, NSW 2026 (AU)

( * ) Notice: Subject to any disclaimer, the term of this patent is extended or adjusted under 35 U.S.C. 154(b) by 0 days.

(21) Appl. No.: 09/555,099
(22) PCT Filed: Nov. 18, 1998
(86) PCT No.: PCT/AU98/00953
§ 371 (c)(1), (2), (4) Date: May 24, 2000
(87) PCT Pub. No.: WO99/27259
PCT Pub. Date: Jun. 3, 1999

(30) Foreign Application Priority Data

Nov. 24, 1997 (AU) ............................................... PP0496
May 22, 1998 (AU) ............................................... PP3638

(51) Int. Cl.$^7$ ............................................... H01J 49/24
(52) U.S. Cl. .................. 250/441.11; 250/251; 250/310; 250/311; 250/289; 250/288
(58) Field of Search ............................ 250/441.11, 310, 250/311, 251, 289, 288

(56) References Cited

U.S. PATENT DOCUMENTS

| | | | |
|---|---|---|---|
| 4,425,084 A | 1/1984 | Tell | 417/161 |
| 5,432,343 A * | 7/1995 | Gulcicek et al. | 250/288 |
| 2002/0003210 A1 * | 1/2002 | Marcus | 250/288 |

OTHER PUBLICATIONS

Sov. Phys. Tech. Phys., vol. 30, No. 1, issued Jan. 1985 (American Institute of Physics, USA) V.I. Ermolov et al., "Structure and pumping properties of the inner portion of a supersonic ring jet", pp. 105–111 (whole document).

Derwent Abstract Accession No. 91–243930/33, Class Q68, SU 1463051 A (Legend Nuclear Phys (LEKA) Dec. 23, 1990.

Derwent Abstract Accession No. 94–116517/14, Class Q56, RU 2004854–C1 (Aerohydrodynamic Inst) Dec. 15, 1993 Abstract.

Patent Abstracts of Japan, JP 7–192897 A (Rikagaku Kenkyusho) Jul. 28, 1995.

* cited by examiner

Primary Examiner—Bruce Anderson
Assistant Examiner—Nikita Wells
(74) Attorney, Agent, or Firm—Michael D. Bednarek; Shaw Pittman LLP

(57) ABSTRACT

An aperture (5) connects a first chamber (1) with a second chamber (2), and is surrounded by an annular nozzle (7) formed by inner and outer walls (6, 8), which connects the first chamber (1) with a third chamber (3). A supersonic annular gas jet (9) is ejected by the annular nozzle (7) into the first chamber (1), creating a Venturi pumping action at the core of the jet in the vicinity of the aperture (5). The second chamber (2) may thus be maintained at a substantially lower pressure than the first chamber (1). Inner wall (6) and outer wall (8) may be relatively movable for varying gas flow, and the first chamber (1) may include baffles or skimmers to modify gas flow, e.g., to create a high density molecular beam. An electron or ion beam (4) may be transferred from the second chamber (2) to the first chamber (1), e.g., as part of an environmental scanning electron microscope.

21 Claims, 2 Drawing Sheets

DIFFERENTIAL PUMPING VIA CORE OF ANNULAR SUPERSONIC JET

TECHNICAL FIELD

The present invention pertains to the technical field of physical sciences and technology. More specifically it involves technologies of vacuum technique, gas dynamics and charged particle beams.

BACKGROUND ART

There are instruments which require the transfer of particle beams from one chamber of low pressure (or vacuum) into a chamber with substantially higher pressure. The maintenance of a pressure difference between two chambers communicating with each other via a free aperture is achieved with the well known art of differential pumping. According to this art, one of the chambers is pumped out while the other is maintained at constant pressure by supplying gas to compensate the amount of gas leaking through the aperture. A steady state situation of gas flow and a steady pressure difference is achieved between the two chambers. This constitutes a single stage differential pumping and it may be repeated to form two, three and so on stages of differential pumping.

Sharp pressure gradients develop along the axis of the aperture which limits the gas flow. The aperture resists the flow of gas like a resistor opposes the electrical current In an electrical circuit. Gas flows from the chamber of high pressure into the chamber of low pressure and a supersonic jet develops downstream shortly past the aperture plane. This aperture has been referred to as pressure limiting aperture (PLA) in the literature (references 1,2) and has been studied by the science of gas dynamics. The amount of gas flow and the length of jet depends on the geometry of the aperture, the nature and temperature of gas and the pressures used in the two chambers. These properties determine the performance and cost of the system and impose some practical limits. For example, in order to achieve high pressure differentials with large apertures, large pumping capacities are required. Furthermore, the supersonic gas jet can extend over a long path which can interfere with the performance of certain instruments. The present invention discloses a radically new method and apparatus that it both overcomes the disadvantages of prior art and it also constitutes an alternative approach to achieve an equivalent result to the conventional pressure limiting aperture.

According to the present invention, a substantial pressure difference between chambers communicating via a PLA can be achieved by forcing the gas from the chamber of low pressure to flow towards the chamber of high pressure using the pumping action of the Venturi principle. According to the Venturi principle, a gas stream creates its own pumping action by entraining gas molecules of the surrounding gas. The inventive step of the present invention lies in the introduction of an annular supersonic jet surrounding the PLA and flowing towards the high pressure chamber. The gas of the annular jet is supplied by a third chamber of a higher pressure than the pressure of the chamber into which it flows. In the steady state situation, pressure gradients are again established between the two sides of the PLA.

The Venturi principle is well known and has been used in the construction of vacuum pumps (references 3,4,5). The present invention integrates this principle with the design of a pressure limiting aperture to be used in whatever instruments it is required. One example of such an instrument, on which it can be used, is the environmental scanning electron microscope (ESEM) whereby an electron beam is transferred from chambers of high vacuum into chambers of progressively higher pressure.

DETAILED DISCLOSURE OF THE INVENTION

This invention relates to a novel device for achieving a pressure difference between two chambers, namely, between first and second chamber, which communicate via an aperture (the PLA). A third chamber is added, which is maintained at substantially higher pressure than the first chamber with which it communicates via an annular orifice surrounding the PLA. Gas flows from the third chamber into the first chamber through the annular orifice, and an annular supersonic jet develops in the first chamber. The core of the annular jet creates a Venturi pumping action by entraining any gas molecules entering In it. The core of the annular jet communicates via the PLA with said second chamber which, as a result, is evacuated by the pumping action of the annular jet. Gas is removed from the first chamber by a vacuum pump at a rate equal to the rate of gas supply by the annular jet plus the relative rate of gas supply by the PLA. In the steady state situation, a substantial pressure difference is established between the first and second chamber due to the pumping action of the annular jet.

There is an interdependence among the pressure levels of first, second and third chamber, which depends on the design characteristics of the system. The ultimate pressure differential that is achieved by the present invention critically depends on the geometry, pressures, temperatures, nature of gases as well as the materials and surfaces used in the system. The optimum system is also dependent on the practical requirements of the purpose (i.e. application) for which it is used.

Although the basic features of the invention have been described above, it will be appreciated that numerous variations, modifications, or alterations may be effected to certain parameters of the system without departing from the spirit or scope of the invention. One such parameter is the geometry of the flow, which will be examined in more detail in the description that follows. The gas flow characteristics can be modified by the presence of certain objects placed in first chamber under certain conditions. An object will not substantially affect the gas flow when it is placed at sufficiently long distance from the PLA. However, an object will modify the geometry of the flow and hence the gas flow properties when it is placed within the range of action of the annular jet. Out of numerous cases, two cases involving variations of geometrical flow are described below.

It is a another form of the present invention to insert objects that modify the gas flow in order to achieve a specific result. When an object is placed within the range of action of the annular jet, a higher pressure is generally exerted on the specimen close to the axis of the jet than the background pressure of first chamber. This higher pressure is due to the dynamic pressure exerted by the kinetic energy of the jet and it can be regulated by the geometry of the system. This higher pressure can be used as an advantage to achieve a higher pressure differential between first and second chamber. In order to equalise the background pressure of the first chamber to the higher pressure at the axis of the jet, a baffle (object) is inserted and fixed in the first chamber. This baffle comprises a surface with an orifice placed co-axially with the PLA. The annular jet impinges on the baffle and the reflected gas flows over the baffle wherefrom it is removed with a pump.

It is a further form of the present invention to create maximum gas concentration only along the axis of the system in the first chamber, namely, the creation of a high intensity molecular beam. A molecular beam formed inside the first chamber constitutes the opposite effect achieved with the baffle outlined above. A molecular beam is formed by replacing the baffle with a skimmer such as is known and used in molecular beam technology. A skimmer has the property of separating, or "skimming", the outer region of a jet while allowing the passage of the core of a jet undisturbed through the orifice of the skimmer. In this case, pumping is required on both sides of the skimmer, namely, first to remove the skimmed gas from the annular jet on one side of the skimmer and second to remove the gas of the molecular beam after the latter strikes a specimen under examination. In this configuration of the invention, the pressure differential is formed between second chamber and the core of a molecular beam in first chamber. This allows the transfer of an electron or ion beam from the low pressure of second chamber into the first chamber along and inside a molecular beam, so that both the charged particle beam and the molecular beam are concurrent and co-interact with the specimen surface under examination.

The flow characteristics can be further modified by varying the shape of the annular orifice, but this invention is not limited by a particular choice of this geometry.

Another parameter that modifies the performance of the present device is the temperature of various gases and surfaces of the flow, especially the temperature of the input gas in said third chamber. The range of pressure levels and pressure differentials obtained is a function of the temperature. It will be appreciated that no particular choice of this parameter deviates from the scope and spirit of this invention.

The present invention is based on a well known physical principle which is used in air operated Venturi and in diffusion vacuum pumps. However, it can be ascertained by anyone skilled in vacuum technology that both the scope and design of the present invention is different from all previous art. The physical principle of this invention has not been previously used in the mode and scope disclosed herewith. Furthermore, the present invention adds a new design of pump with a specific range of application to vacuum technology itself. In addition, the configuration of the present invention can be used to design and construct Venturi type vacuum pumps, wherein said third chamber is connected with a positive air pressure source, said second chamber forms the suction (inlet) of the pump and said first chamber is open to ambient atmosphere.

A corollary disclosure of the present invention reveals means for forming a dense molecular beam, in general. The present method differs from conventional sources where the jet is formed in a single central nozzle and subsequently skimmed. The present system starts with an annular jet, instead, formed around a central spindle with or without a hole. This system is equivalent, or acts in a similar manner, to a garden hose sprinkler whereby a water jet can be "focussed" or "spread" by shifting the spindle along the axis of the sprinkler nozzle.

These and further objectives of the invention will be apparent from the following description of the invention as illustrated in the accompanying three Figures.

MODES FOR CARRYING OUT THE INVENTION

To assist with understanding of the invention, reference will now be made to the accompanying drawings which embody some examples of the invention.

Figure 1:
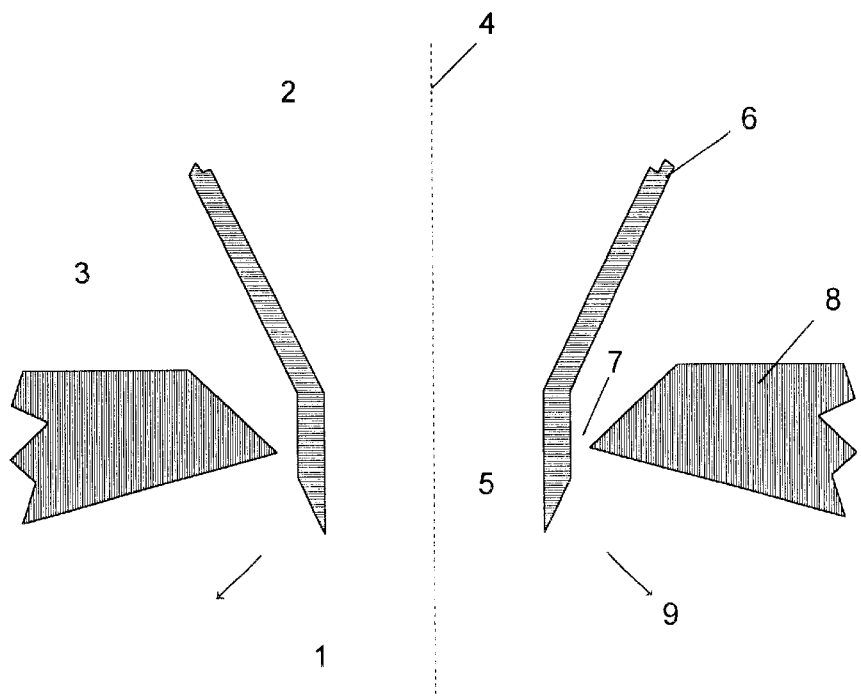
FIG. 1 Diagram of the reverse flow pressure limiting aperture.

One embodiment of the present invention is shown in FIG. 1. The device comprises first chamber 1, second chamber 2 and third chamber 3. The device is axially symmetric around the axis 4. Chamber 1 communicates with chamber 2 via an aperture 5 (the PLA) defined by an inner nozzle 6. Chamber 1 communicates with chamber 3 via an annular orifice 7 defined between the inner nozzle 6 and an outer nozzle 5. Chamber 3 is maintained at a higher pressure than chamber 1 so that gas can flow from 3 to 1. The annular gaseous flow formed, after it passes the throat of the annular orifice 7, expands and forms a supersonic annular jet 9 inside chamber 1. Gas is removed from chamber 1 by an appropriate pump. The supersonic jet eventually collides with the background gas of the chamber and a steady state flow is established. Under such conditions, the central region of the gaseous Jet continuously entrains any gas molecules that pass through the PLA 5 from chamber 2. As a result, chamber 2 is continuously pumped out by the supersonic jet flow and a low equilibrium pressure is achieved in chamber 2. In this way, a pressure difference is established between chambers 1 and 2. Generally, gas tends to flow from chamber 2 to chamber 1 (i.e. in reverse direction relative to previous art), but at the equilibrium situation the direction of the net flow through PLA depends on how the pressure of chamber 2 is controlled. The direction of flow will go the other way when chamber 2 is maintained by an independent pump at a pressure below the level sustainable by the annular jet mechanism; if there is no leak or outgassing in chamber 2 then the net gas flow through PLA is zero at the steady state situation.

The embodiment of FIG. 1 is not restrictive as to the precise dimensions and geometry used. The inner nozzle can be fixed or movable. When the inner nozzle moves along the axis, the annular gas jet can form a concentrated (focussed) molecular beam or it can diffuse (de-focus) towards a uniform gas distribution. Other geometrical parameters also can be adjustable. Typical working parameters are: inside diameter of inner nozzle=0.5 mm, outside diameter of inner nozzle=0.6 mm, inside diameter of outer nozzle=0.8 mm, pressure range of chamber 1 between 10–1000 Pa, pressure range of chamber 2 between 0.1–50 Pa, pressure range of chamber 3 between 500–50000 Pa. The inner nozzle protrudes into chamber 1 by about 0.1 mm. The relationship between pressures is not linear and several orders of magnitude pressure ratios between chamber 1 and 2 can be achieved. These values are indicative only and do not restrict the scope of the invention. The geometry of the flow can be further modified as shown below.

Figure 2:
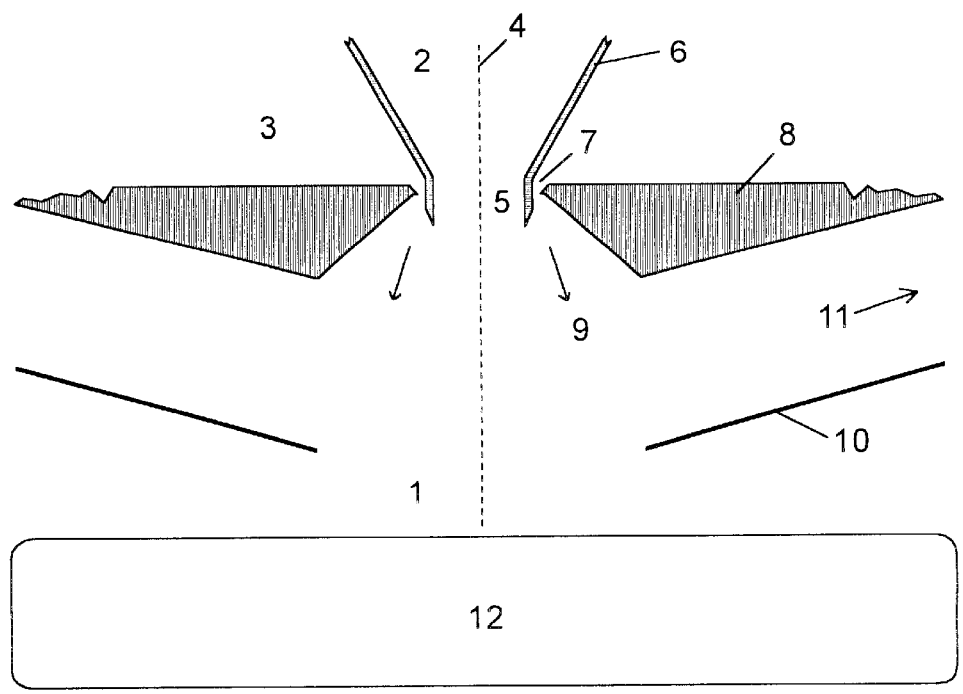
FIG. 2 Diagram of the reverse flow pressure limiting aperture incorporating a baffle.

Another mode of the present invention is shown by the embodiment of FIG. 2. The device comprises first chamber 1, second chamber 2 and third chamber 3. The device is axially symmetric around the axis 4. Chamber 1 communicates with chamber 2 via an aperture 5 (the PLA) defined by an inner nozzle 6. Chamber 1 communicates with chamber 3 via an annular orifice 7 defined between the inner nozzle 6 and an outer nozzle 8. Chamber 3 is maintained at a higher pressure than chamber 1 so that gas can flow from 3 to 1. An annular gaseous flow formed, after it passes the throat of the annular orifice 7, expands and forms a supersonic annular jet 9 inside chamber 1. A baffle 10 is inserted in the wake of the annular jet which is diverted in the direction 11 between baffle and outer nozzle wherefrom the gas is pumped by appropriate means. The supersonic jet collides with the background gas and the baffle and a steady state flow is established. Under such conditions, the central region of the gaseous jet continuously entrains any gas molecules that enter through the PLA 5 from chamber 2. As a result, chamber 2 is continuously pumped out by the supersonic jet flow and a low equilibrium pressure is achieved in chamber 2. In this way, a pressure difference is established between chambers 1 and 2. A stagnation condition with a uniform pressure is created in chamber 1 where a specimen 12 is positioned for examination. The stagnation pressure around the specimen is uniform and equals to the sum of static and dynamic pressure of the gas jet near the plane of the baffle orifice. Effectively, a higher pressure difference between the specimen chamber 1 and chamber 2 is achieved with the presence of a baffle. In addition, different gases can be used in chambers 1, 2 and 3. For example, the specimen chamber can be supplied with water vapour while argon is used in chamber 3. The pressure in chamber 1 can be regulated so that a small amount of gas flows through the orifice of the baffle into the jet stream in direction 11. Conversely, the jet gas from chamber 3 can be made to slightly flow over the specimen by slightly lowering the specimen chamber pressure. Thus, the nature of gas over the specimen can be regulated.

Figure 3:
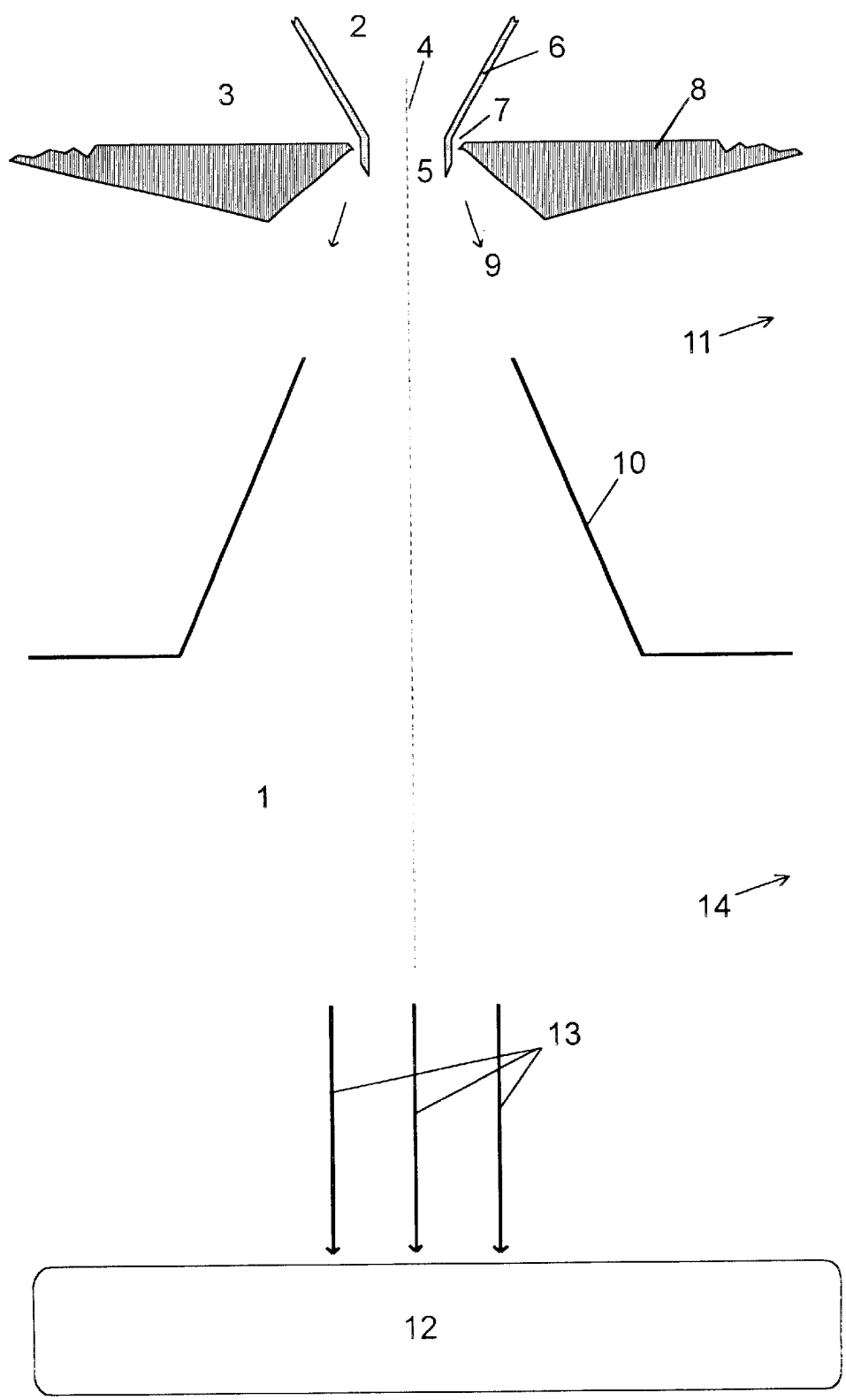
FIG. 3 Diagram of the reverse flow pressure limiting aperture incorporating a skimmer.

A further mode of the present invention is shown by the embodiment of FIG. 3. The system comprises first chamber 1, second chamber 2 and third chamber 3. The device is axially symmetric around the axis 4. Chamber 1 communicates with chamber 2 via an aperture 5 (the PLA) defined by an inner nozzle 6. Chamber 1 communicates with chamber 3 via an annular orifice 7 defined between the inner nozzle 6 and an outer nozzle 8. Chamber 3 is maintained at a higher pressure than chamber 1 so that gas can flow from 3 to 1. An annular gaseous flow formed, after it passes the throat of the annular orifice 7, expands and forms a supersonic annular jet 9 inside chamber 1. A skimmer 10 is inserted in the wake of the annular jet. The skimmer removes the peripheral fraction of the annular jet in the direction 11 wherefrom the gas is removed by a pump. The skimmer allows the core fraction of the annular jet to pass undisturbed through its central orifice and to form a molecular beam 13 of high density. The molecular beam is formed for the purpose of striking a specimen 12, after which the gas molecules are removed by pumping 14. In the steady state situation the annular jet first continuously entrains any gas molecules that enter through the PLA 5 from chamber 2 and subsequently forms a molecular beam further downstream. In this way. a pressure difference is established between chamber 2 and a thin cylindrical portion along the axis of chamber 1.

It should be appreciated that FIGS. 1, 2 and 3 do not restrict the scope and design of the present invention. Various parameters can vary to obtain a different result in different applications. It will be apparent to those skilled in the art that various changes and modifications may be made therein without departing from the spirit of the invention.

The present system can be combined with ancillary devices to facilitate a desired result in different applications and such combinations fall within the scope of the present invention. It can be combined or integrated with components of other instruments. For example, the baffle, the inner and outer nozzles, all of which were outlined above, can also function as electrodes or parts of a gaseous detection device (static or oscillatory) as used in electron microscopes. It can be integrated with detection, shielding, metering devices and electron optics systems. Again, it will be apparent to those skilled in the art that various changes and modifications may be made therein to allow a combination and integration with other instruments without departing from the spirit of the invention.

INDUSTRIAL APPLICABILITY

The present device can be incorporated or integrated with various instruments such as those described herewith.

Typical industrial applications of the present invention are with instruments employing an electron or ion beam as outlined below:

The present invention can be integrated with a scanning electron microscope (SEM). Conventionally, the SEM employs an electron beam in vacuum (i.e. in very low gas pressure) condition but, with the inclusion of a reverse flow PLA (RF-PLA), the electron beam can be transferred into a gaseous environment of substantial pressure. This is achieved by identifying the first chamber (1) of the present invention with the specimen chamber of the SEM and the second chamber (2) of the invention with the electron optics region of the SEM, while the electron beam travels along the axis of the system. The electron beam strikes a specimen in the high pressure environment and the emanating signals are detected by suitable means.

A further industrial application of the present invention is with an environmental scanning electron microscope (ESEM) whereby the previously used PLA is replaced by a RF-PLA. The electron beam is transferred through the RF-PLA which separates the electron optics from the specimen chamber, i.e. the beam is transferred from vacuum to high pressure. The electron beam strikes the specimen in the chamber and the emanating signals are detected by suitable means.

Another application of the present invention is with a scanning transmission electron microscope (STEM). A STEM differs from a SEM in the sense that the focussed scanned electron beam is transmitted through a thin section of a specimen. Depending on the mode of operation of a STEM, the present invention can be expanded to incorporate a second RF-PLA system which is a mirror image of the first RF-PLA system across a plane parallel to the specimen section. In this dual RF-PLA system, the electron beam is first transferred from high vacuum to high pressure around the specimen and then to high vacuum again. Various signals and the transmitted beam are processed by suitable means.

Another application of the present invention is with a conventional electron microscope (CEM). In this application, the present invention is expanded to incorporate a second RF-PLA system which is a mirror image of the first RF-PLA system across a plane parallel to the specimen section. In this dual RF-PLA system, the electron beam is first transferred from high vacuum to high pressure around the specimen and then to high vacuum again whereby an image is formed according to known art.

Another application is with microscopes employing an ion beam as a probe. The ion beam can be transferred from a high vacuum condition into a gaseous environment of substantial pressure wherein the specimen under examination is positioned.

Another application is with instruments employing electron and ion beams for purposes other than microscopy. The electron or ion beam interaction with a specimen can be utilised for analysis, or for specimen modification. Electron/ ion beam technologies have been developed for microelectronics applications. The latter applications involve testing and micro-fabrication, such as milling and etching, or growth and material deposition. The present invention is well suited in all such applications on account of the possibility of introducing a gas around a specimen which, in turn, gives rise to a multiplicity of new applications.

Another application is to use the present devise as a modified Venturi pump. A novel pump is obtained by identifying chamber 2 as the inlet (suction) of the pump, chamber 3 as the gas supply source (with positive or negative pressure) and chamber 3 as the exhaust chamber (with ambient or negative pressure).

The present system can be combined or integrated with various components of other instruments. For example, the baffle, the inner and outer nozzles, which were outlined above, can also function as electrodes or parts of a gaseous detection device (static or oscillatory), e.g. as used in ESEM. It can be integrated with detection, shielding, metering devices and electron optics systems.

One advantage of the present invention is that it allows the use of improved electron optics and field of view.

Now, referring to FIGS. 1, 2 and 3, several other advantages are gained as described below:

One other advantage is that chamber 1 is continuously fed by a gas stream immediately impinging on the specimen under examination. It is now possible to effect an abrupt or quick change of the gas on the specimen surface by a change of the gas used in chamber 3. This is an advantage in ion beam technology, in micro-fabrication, in micro-electronics industry and some applications in electron microscopy.

Another advantage is that the back-flow of impurity gases (e.g. by outgassing specimens) from chamber 1 into chamber 2 is minimised or practically eliminated with the present invention. This is an advantage in electron microscopes and ion beam instruments where the electron optics must be protected from deleterious contaminants and only clean gases may be allowed to leak into chamber 2.

Another advantage is that chambers 1, 2 and 3 can be flooded with two or three different gases at different pressures and the gases being effectively separated.

Another advantage is that the charged beam suffers significantly less particle losses by way of collisions as the beam is transferred from chamber 2 into chamber 1. This advantage is due to the fact that the mass thickness in the transition region of the present device is less than the corresponding mass thickness in the transition region of PLA in previous art. In previous PLA art, a gaseous jet develops above the aperture, while in the present method such a jet is absent, with a concomitant depletion zone below the aperture. The present advantage becomes significant in charged beams of low energy and high scattering cross-sections.

Another advantage of the present invention is that no pump is needed to evacuate chamber 2, and, thus, the present method operates with one less pump/stage.

A further advantage is that it provides alternative means of differential pumping to existing technologies, which allows more diverse and competitive industries.

REFERENCES

1. Danilatos G D. U.S. Pat. No. 4,596,928. Method and apparatus for an atmospheric scanning electron microscope, filed May 14, 1984.
2. Danilatos G D. Foundations of Environmental Scanning Electron Microscopy, Advances in Electronics and Electron Physics, Vol. 71, 109–250(1988).
3. Crawford W W. The parallel jet vacuum pump, Phys. Review 10, 557–563(1917).
4. Lasto C L. U.S. Pat. No. 4,880,358. Ultra-high vacuum force, low air consumption pumps, filed Jun. 20, 1988.
5. Tell P. U.S. Pat. No. 4,425,084. Ejector device, filed Nov. 24, 1981.

What I claim is:

1. A device for generating and maintaining a gas pressure difference between two chambers, which comprises:
   (a) first and second chamber interconnected via an aperture;
   (b) said aperture being defined by the inside wall of an inner nozzle;
   (c) third chamber connected via an annular orifice with said first chamber;
   (d) said annular orifice being defined between the outside wall of said inner nozzle and the inside wall of an outer nozzle which surrounds the inner nozzle;
   (e) said first chamber being maintained at a given gas pressure;
   (f) said third chamber being maintained at a substantially higher gas pressure than the pressure of first chamber so that gas flows and forms a supersonic annular gas jet in the direction from third to first chamber;
   (g) said second chamber being maintained at substantially lower gas pressure by the action of said annular gas jet flow;
   (h) means for supplying a gas in said third chamber;
   (i) means for removing gas from said first chamber.

2. A device according to claim 1 wherein said inner nozzle is movable relative to said outer nozzle.

3. A device according to claim 1 wherein it comprises means to control the temperature of the gaseous flow, preferably by heating the input gas in said third chamber, or by directly heating the said inner or outer nozzle.

4. A device according to claim 1 wherein, in addition, it comprises:
   (a) a baffle placed downstream of the supersonic jet inside said first chamber, said baffle having an orifice which is co-axial with said aperture, said baffle being positioned so as to intercept said supersonic jet;
   (b) means for removing the gas which flows between the baffle and said outer nozzle;
   (c) means for varying the pressure in said first chamber by introducing or removing gas therein.

5. A device according to claim 1 wherein, in addition, it comprises:
   (a) a skimmer placed downstream of the supersonic jet inside said first chamber, said skimmer having an orifice which is co-axial with said aperture, said skimmer allowing the formation of a molecular beam inside said first chamber, said molecular beam being co-axial with said aperture;
   (b) means for removing the gas which flows between the skimmer and said outer nozzle;
   (c) means for removing the gas contributed by said molecular beam in said first chamber.

6. A device according to claim 1 which, in addition, comprises an electron beam transferred through said aperture.

7. A device according to claim 1 which, in addition, comprises an ion beam transferred through said aperture.

8. A scanning electron microscope which comprises:
   (a) a device according to claim 6 wherein said electron beam is the electron beam of said microscope;

(b) said first chamber being coincident with the specimen chamber of said microscope;

(c) said second chamber terminating the electron optics column of said microscope;

(d) said electron beam striking the surface of a specimen situated inside said first chamber;

(e) the ensuing signals from the beam-specimen interaction being detected by appropriate means.

9. An environmental scanning electron microscope which comprises:

(a) a device according to claim 6 wherein said electron beam is the electron beam of said microscope;

(b) said first chamber being coincident with the specimen chamber of said microscope;

(c) said second chamber terminating the electron optics column of said microscope;

(d) said electron beam striking the surface of a specimen situated inside said first chamber;

(e) the ensuing signals from the beam-specimen interaction being detected by appropriate means.

10. A scanning transmission electron microscope which comprises:

(a) a device according to claim 6 wherein said electron beam is the electron beam of said microscope;

(b) said first chamber being coincident with the specimen chamber of said microscope;

(c) said second chamber terminating the electron optics column of said microscope;

(d) said electron beam transmitting through a thin specimen section situated inside said first chamber;

(e) the ensuing signals from the beam-specimen interaction being detected by appropriate means.

11. A scanning transmission electron microscope which comprises first device according to claim 6 and second device according to claim 6 in the following manner:

(a) said first chamber of first device coinciding with first chamber of second device to form a common chamber, said common chamber coinciding with the specimen chamber of said transmission scanning electron microscope;

(b) said second chamber of first device and said second chamber of second device being disposed on either side of said specimen chamber;

(c) said first and second device having a common axis;

(d) the electron beam entering the specimen chamber through the aperture of first device, then said beam transmitting through a thin specimen, thereafter said beam exiting the specimen chamber through the aperture of second device;

(e) the emitted signals from the beam-specimen interaction and said transmitted beam being processed by appropriate means.

12. A conventional electron microscope which comprises first device according to claim 6 and second device according to claim 6 in the following manner:

(c) said first chamber of first device coinciding with first chamber of second device to form a common chamber, said common chamber coinciding with the specimen chamber of said conventional electron microscope;

(b) said second chamber of first device and said second chamber of second device being disposed on either side of said specimen chamber, (c) said first and second device having a common axis;

(d) the electron beam entering the specimen chamber through the aperture of first device, then said beam transmitting through a thin specimen, thereafter said beam exiting the specimen chamber through the aperture of second device;

(e) the transmitted beam and signals from the beam specimen interaction being processed by appropriate means.

13. A device of claim 6 wherein said electron beam pertains to instruments used for testing and micro-fabrication.

14. A device of claim 7 wherein said ion beam pertains to instruments used for testing and micro-fabrication.

15. A Venturi type vacuum pump which comprises a device according to claim 1 wherein said second chamber acts as the inlet pipe of the pump.

16. A Venturi type vacuum pump which comprises a device according to claim 1 in the following manner:

(a) said first chamber being open to ambient pressure;

(b) said second chamber being the inlet pipe of the pump;

(c) said third chamber being connected to a high (i.e. positive) pressure source.

17. Any apparatus which incorporates a device according to claim 1.

18. A method for generating and maintaining a gas pressure difference between two chambers, which comprises:

(a) first and second chamber interconnected via an aperture;

(b) said aperture being defined by the inside wall of an inner nozzle;

(c) third chamber connected via an annular orifice with said first chamber;

(d) said annular orifice being defined between the outside wall of said inner nozzle and the inside wall of an outer nozzle which surrounds the inner nozzle;

(e) said first chamber being maintained at a given gas pressure;

(f) said third chamber being maintained at a substantially higher gas pressure than the pressure of first chamber so that gas flows and forms a supersonic annular gas jet in the direction from third to first chamber;

(g) said second chamber being maintained at substantially lower gas pressure by the action of said annular gas jet flow;

(h) means for supplying a gas in said third chamber;

(i) means for removing gas from said first chamber.

19. A method according to claim 18 wherein said inner nozzle is movable relative to said outer nozzle.

20. A method according to claim 18 wherein it comprises means to control the temperature of the gaseous flow, preferably by heating the input gas in said third chamber, or by directly heating the said inner or outer nozzle.

21. Any apparatus which incorporates a method according to claim 18.

* * * * *